(12) United States Patent
Avramescu et al.

(10) Patent No.: US 7,198,981 B2
(45) Date of Patent: Apr. 3, 2007

(54) VACUUM SEALED SURFACE ACOUSTIC WAVE PRESSURE SENSOR

(75) Inventors: Viorel V. Avramescu, Bucharest (RO); Cornel P. Cobianu, Bucharest (RO); Ioan Pavelescu, Bucharest (RO)

(73) Assignee: Honeywell International Inc., Morristown, NJ (US)

( * ) Notice: Subject to any disclaimer, the term of this patent is extended or adjusted under 35 U.S.C. 154(b) by 198 days.

(21) Appl. No.: 10/971,140

(22) Filed: Oct. 21, 2004

(65) Prior Publication Data

US 2006/0086188 A1 Apr. 27, 2006

(51) Int. Cl.
*H01L 21/44* (2006.01)
*H01L 21/48* (2006.01)
*H01L 21/50* (2006.01)

(52) U.S. Cl. ..................... 438/107; 257/521
(58) Field of Classification Search ........... 257/521; 438/107, 456, 735
See application file for complete search history.

(56) References Cited

U.S. PATENT DOCUMENTS

| | | | |
|---|---|---|---|
| 3,978,731 A | 9/1976 | Reeder et al. | 73/407 PR |
| 4,100,811 A | 7/1978 | Cullen et al. | 73/654 |
| 4,216,401 A | 8/1980 | Wagner | 310/313 R |
| 4,382,386 A | 5/1983 | Coussot et al. | 73/703 |
| 4,454,440 A | 6/1984 | Cullen | 310/313 R |
| 4,480,148 A | 10/1984 | Archer | 174/51 |
| 4,699,682 A | 10/1987 | Taikishima | 156/292 |
| 4,845,397 A | 7/1989 | Herrick et al. | 310/348 |
| 4,933,588 A | 6/1990 | Greer | 310/313 D |
| 4,955,149 A | 9/1990 | Ottieri | 36/119 |
| 5,059,848 A | 10/1991 | Mariani | 310/313 R |
| 5,424,249 A | 6/1995 | Ishibashi | |
| 5,739,419 A * | 4/1998 | Maier et al. | 73/37 |
| 5,867,074 A * | 2/1999 | Ogiso et al. | 333/193 |
| 6,003,378 A | 12/1999 | Scherr et al. | 73/703 |
| 6,084,503 A | 7/2000 | Ruile et al. | 340/10.1 |
| 6,144,332 A | 11/2000 | Reindl et al. | 342/42 |
| 6,329,739 B1 | 12/2001 | Sawano | 310/313 R |
| 6,571,638 B2 | 6/2003 | Hines et al. | 73/702 |
| 6,878,638 B2 * | 4/2005 | Regan et al. | 438/735 |
| 2002/0079549 A1 | 6/2002 | Yoshihara et al. | |

FOREIGN PATENT DOCUMENTS

GB 2235533 A 6/1991
WO WO 2004/082137 9/2004

* cited by examiner

OTHER PUBLICATIONS

*Quartz Pressure Sensor Based on SAW Reflective Delay Line*; H. Scherr, G. Scholl, F. Seifert, R. Weigel; 1996 IEEE Ultrasonics Symposium PCT-Notification of Transmittal of The International Search Report and The Written Opinion of the International Searching Authority, or the Declaration, Date of Mailing Aug. 3, 2006.

*Primary Examiner*—Phuc T. Dang
(74) *Attorney, Agent, or Firm*—Kris T. Fredrick

(57) ABSTRACT

A vacuum sealed SAW pressure sensor is disclosed herein, which includes a sensing element configured as a SAW device (e.g., SAW resonator or SAW delay line) supported by a thin diaphragm. The substrate material can be implemented as a quartz wafer (i.e., a "base" wafer). The SAW device can be configured on one side of the wafer and the diaphragm etched on the opposite side. A quartz micromachined pressure sensor can thus be realized, which operates based on a variation of the surface wave velocity of a SAW device situated on the thin diaphragm. The SAW sensor is generally sealed in a vacuum and diaphragm sustains the sensor, thereby implementing a sensor on a wafer scale while allowing for a cost reduction per chip.

17 Claims, 4 Drawing Sheets

VACUUM SEALED SURFACE ACOUSTIC WAVE PRESSURE SENSOR

TECHNICAL FIELD

Embodiments are generally related to surface acoustic wave sensors. Embodiments are also related to pressure sensors based surface acoustic wave (SAW) technology. Embodiments are additionally related to micro electromechanical systems (MEMS).

BACKGROUND OF THE INVENTION

Surface acoustic wave (SAW) devices have been utilized in a number of sensing applications, and have been adapted for use with telecommunications equipment for the realization of delay lines and filters. Filters and delay lines require very good temperature and stress stability. Proper design, material choice (e.g., quartz cuts) and packaging techniques have lead to the realization of devices having improved performances. Note that such "improved performances" are principally related to the stability of surface wave velocities, which must remain as stable as possible within a specified range of temperature and stress.

The modification of the surface wave velocity due to such aforementioned factors can be utilized for measuring purposes. SAW-based devices have been utilized to measure strain, temperature as well as chemical changes that take place in materials during exposure to chemical agents.

One application of SAW-based sensors, for example, involves the remote interrogation of a SAW-based device by RF wireless signals, due to the fact that a SAW sensor can store energy provided by an RF signal. In this manner, SAW-based sensors do not require an energy source to function, which can be of great interest in some applications.

SAW-based devices are ideal for pressure sensing applications. One important feature of a SAW-based pressure sensor involves the implementation of a proper sensor diaphragm that can withstand the strain or stress induced by pressure. Prior Art SAW-based pressure configurations utilize different materials, such as glue, solder or epoxy adhesive in order to bond a quartz plate, which can be referred to as a "base," having a given thickness to an appropriate substrate.

The quartz plate (i.e., the "base") can sustain the SAW device. The sensitivity of the sensor is related to the thickness of the diaphragm—i.e., equal to the thickness of the quartz plate—as well as to its effective exposed area to pressure. The substrate can be metal, ceramic or other suitable materials. The area of the diaphragm subjected to pressure can be obtained by boring or drilling the substrate. The packaging of such devices should be accomplished with much care in order to ensure an accurate alignment of the sensor to the diaphragm.

Another problem observed in the aforementioned configurations arises from the mismatch between the substrate and the quartz temperature coefficient of expansion (TCE) that induces supplementary and uncontrollable stress into diaphragm. One conventional solution involves the use of a quartz plate instead of metal plate as substrate material.

The two quartz plates—the first one that sustains the sensor ("base" plate) and the second that forms the substrate and is drilled in order to delimit the diaphragm area—can be glued or bonded together. In such a configuration, the stress induced by the mismatch between the TCE can be reduced but, again, the drilling of the quartz substrate and the alignment of the two plates are not accurate. Moreover, drilling a quartz plate is time consuming and can induce defects into the plate. Such defects decrease the strength of the material.

In an improved design, the substrate plate possesses an upper cavity that delimits the diaphragm area and a trough-via that allows pressure to enter into the cavity. The two plates can be bonded together utilizing glass frit technology. Such a method surpasses the previous problems related to stress induces by temperature mismatch and to drilling. The alignment of the diaphragm, however, remains a problem.

Another design involves a carefully configured mechanical support for the quartz plate (i.e., the "base" plate) to avoid the stress induced by the mismatch in TCE between the quartz plate and the substrate. In such a situation, the diaphragm is mechanically deformed by the metallic cover of the sensor. Careful mechanical set-up increases the cost of this sensor.

A second important factor related to the realization of a SAW-based pressure sensor is the necessity of protecting the surface of propagation of the mechanical wave from the atmosphere. The majority of the aforementioned solutions ensure this requirement by providing a vacuum reference chamber, which can be configured during packaging.

Other methods have been implemented to protect the surface of the SAW sensor (not necessarily a pressure sensor). Metallic, ceramic, glass or quartz covers has been utilized to seal the sensor. The bonding of covers with a quartz plate supporting the sensor (i.e., the "base") can be realized by a metal solder, epoxy resin or a glass frit. All such techniques involve some mechanical problems. A polymer sealing method has also been proposed, but is generally not suitable for pressure sensor applications.

It is believed that a solution to the aforementioned problems associated with conventional SAW-based sensor technologies, and particular SAW-based pressure sensors, involves the use of so-called micro electromechanical system (MEMS) technology. Micro Electro Mechanical System (MEMS) is a technology that implements mechanical and electrical parts, using semiconductor-processing techniques. A conventional MEMS device generally includes floating driving parts that are movable over a substrate in order for the device fabricated using MEMS technology to perform mechanical operations. In general, MEMS technology involves the integration of mechanical components, sensors, actuators and other electronic and/or mechanical elements on a common substrate (e.g., silicon) through the use of micro-fabrication or micro-machining manufacturing techniques

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide for an improved surface acoustic wave (SAW) sensor structure that can be realized on ST quartz.

It is another aspect of the present invention to provide for an improved pressure sensor formed from micro-machined technology.

It is yet a further aspect of the present invention to provide for a method and system for the realization of a quartz micro-machined pressure sensor having as a sensing principle the variation of the surface wave velocity of a surface acoustic wave device situated on a thin diaphragm.

It is an additional aspect of the present invention to provide for a SAW pressure sensor that is sealed in a vacuum and which includes a diaphragm that can be formed by deep plasma etching.

It is also an aspect of the present invention to provide for a SAW pressure sensor that can be implemented at a wafer-scale, thereby allowing for a cost reduction per chip thereof.

The aforementioned aspects of the invention and other objectives and advantages can now be achieved as described herein. A vacuum sealed SAW pressure sensor is disclosed herein, which includes a sensing element configured as a SAW device (e.g., SAW resonator or SAW delay line) supported by a thin diaphragm realized on a quartz plate. The aforementioned quartz plate is a part from a wafer that can be implemented as a ST-cut quartz wafer ("base" wafer). Both sides of the quartz wafer can be mirror polished. The SAW device can be configured on one side of the wafer and the diaphragm etched on the opposite side.

According to one embodiment, the diaphragm can be realized by deep plasma etching. Such an etching can be performed utilizing a nickel mask. For such a purpose, a proper nickel layer can be deposited by PVD (physical vapor deposition) or chemical electroplating. The nickel layer can be patterned by micro lithography in order to obtain the desired mask. The aforementioned mask can also be aligned with respect to the SAW sensor utilizing a double-sided alignment and exposure machine.

Such a method and system for the realization of the diaphragm ensures: (i) a precise alignment of the sensor by respect to the diaphragm, (ii) a precise control of the thickness of the diaphragm, (iii) a good quality (roughness) for the realized diaphragm, and (iv) a reduced stress induced into the diaphragm due to a best fit between TCEs.

According to embodiments disclosed herein, the sealing of the device can be realized in a vacuum utilizing a second wafer or plate (i.e., the "cover") that is direct bonded or bonded by an intermediate thin layer of SOG (Spin On Glass) or polymer to the previous wafer (the "base") that contains the sensor. Prior to bonding, the second plate ("cover") can be micro-machined in order to provide a first set of cavities ("grooves") that ensure an over-pressure stop, which prevents the fracture of the diaphragm to over pressures and a second set of cavities ("trenches") that allows a proper sawing for pads thereof. According to such embodiments, a four-sawing process can be utilized in order to completely cut the system formed by the two bonded wafers and thereafter release the devices.

The two wafers can be aligned one with respect to the other utilizing commercially available double-sided alignment equipment. The direct bonding can be performed utilizing commercial equipment typically utilized in MEMS facilities for carrying out anodic bonding silicon to glass. The system formed by the two bonded wafers can be utilized for thinning the wafer ("base" wafer) that supports the SAW sensor. The thinning can be realized by lapping and chemical mechanical polishing (CMP). The purpose of this supplementary process is to decrease the time devoted to dry etching of the diaphragm.

The diaphragm on the "base" wafer can be realized by dry etching only after performing the aforementioned bonding of the two wafers and polishing the "base" wafer. The packaging of the device can be realized by conventional molding techniques utilized in Integrated Circuit (IC) manufacturing facilities. For this purpose a special lead frame can be designed in order to allow direct access to the sensor diaphragm after molding.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate at least one embodiment of the present invention and are not intended to limit the scope of the invention.

Figure 1A:
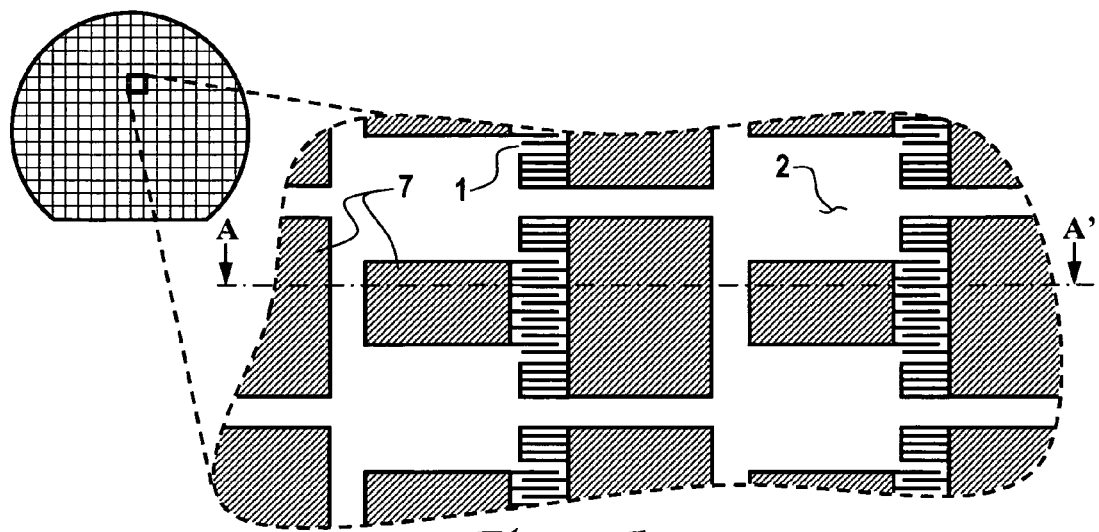
FIG. 1(a) illustrates an upper view of a part of a wafer supporting a plurality of resonators, in accordance with a preferred embodiment.
Figure 1B:
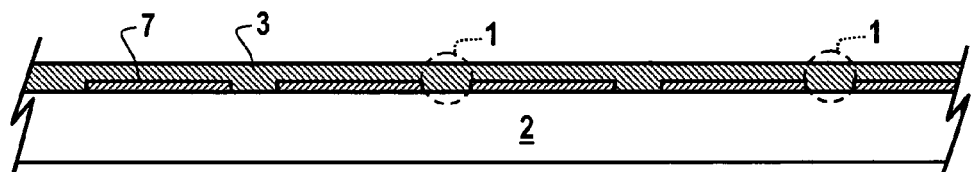
FIG. 1(b) illustrates a view of the AA' cross section from FIG. 1(a), in accordance with a preferred embodiment.

FIG. 1(a) illustrates an upper view of a part of a wafer supporting a plurality of resonators, in accordance with a preferred embodiment. FIG. 1(b) illustrates a view of the AA' cross section from FIG. 1(a), in accordance with a preferred embodiment. Note that in FIGS. 1–8 disclosed and illustrated herein, identical or similar parts are generally indicated by identical reference numerals.

As depicted in FIG. 1(a), a SAW resonator 1, which functions as a main sensing element, can be realized on a "base" quartz wafer 2. In order to take advantage of surface wave propagation, the material for the quartz "base" can be, for example, ST-cut quartz or another orientation or material suitable for such propagation. The two wafers ("base" wafer 2 and a "cover" wafer 4 thereof) preferably should possess close values for the temperature expansion coefficients (TCE) in order to ensure a low stress induced by the change in temperature after the bonding. An optimal fit can be obtained if the "cover" wafer 4 is also configured from ST quartz and if the crystallographic orientation is maintained after bonding to the "base" wafer 2. The design of the resonator 1 can be realized according to configuration rules for such devices and is not considered a limiting feature of the embodiments disclosed herein.

A common methodology for configuring the SAW resonator 1 on the "base" wafer 2 is through the use PVD (Physical Vapor Deposition—vacuum evaporation or sputtering) of aluminum followed by a photolithographic process for obtaining the desired pattern for SAW device 1 as depicted in FIG. 1(*a*) and FIG. 1(*b*). Then, the resonator is covered by a protective $SiO_2$ thin layer 3 obtained by a low temperature process as APCVD (Atmospheric Pressure Chemical Vacuum Deposition). In order to prepare the "base" wafer 2 for direct bonding to the "cover" wafer 4, the silicon dioxide layer previously deposited can be polished by CMP (Chemical Mechanical Polishing).

Meantime the "cover" wafer 4 can be patterned for obtaining grooves 5 and trenches 6 that can delimit, after the bonding to the "base" wafer 2, cavities 8 over the resonator(s) 1 and pad regions 7. As the bonding between the two wafers will be realized in vacuum, the closed cavity formed over the resonator can act as a reference vacuum chamber (e.g., refer to chamber 8 depicted in FIG. 3(*b*)) and the realized sensor will be an absolute pressure sensor.

Patterning of the "cover" wafer 4 can be accomplished by dry etching in an ICP (Inductive Coupled Plasma) reactor using Ar: $SF_6/4:1$ or $Xe:SF_6/1:1$. The vacuum during the process can be maintained in an mtorr range, while the etch rate of the quartz is approximately 0.2 microns per minute. A thin layer of nickel (less than 1 micron) forms the mask utilized for patterning the "cover" wafer. Ni can be deposited in vacuum by evaporation or sputtering. The desired pattern can be obtained utilizing a "lift-off" process or by patterning the deposited layer utilizing wet etching and a positive photo resist as a mask.

Figure 3A:
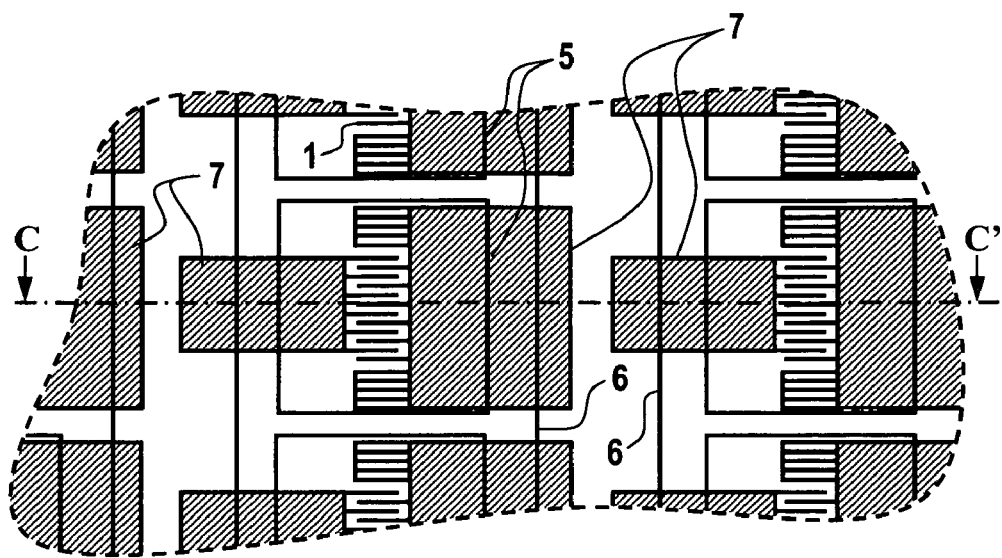
FIG. 3(a) illustrates an upper view of the stack formed after bonding between the "base" and the "cover" wafers, in accordance with a preferred embodiment.
Figure 3B:
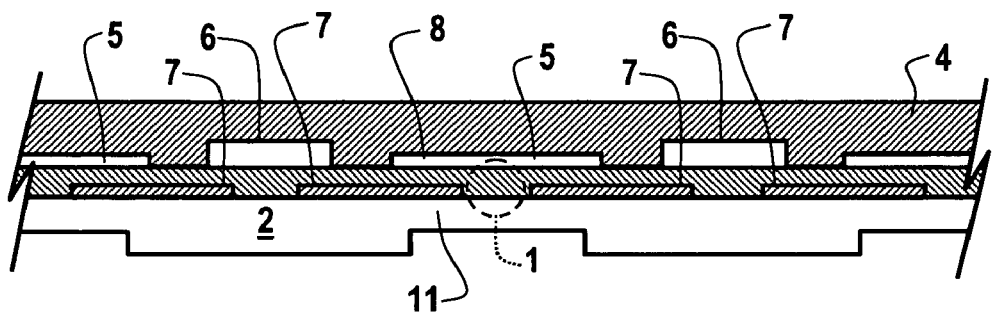
FIG. 3(b) illustrates a view of the CC' cross section from FIG. 3(a) after lapping, CMP and diaphragm realization by deep plasma etching on the "base" wafer, in accordance with a preferred embodiment.
Figure 4:
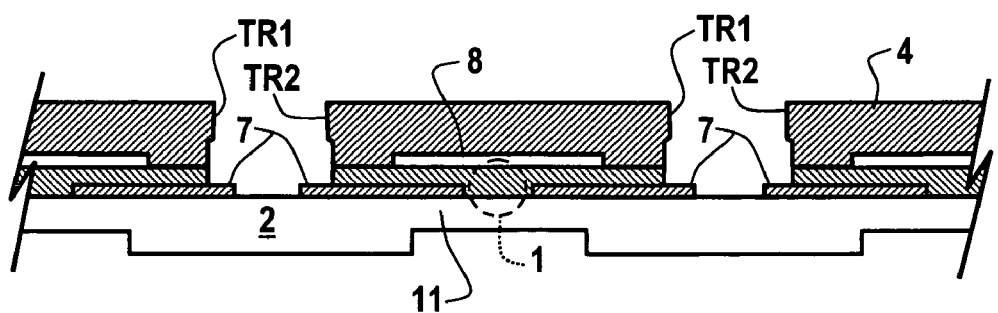
FIG. 4 represents the same view as depicted in FIG. 3(b) after a first dicing step (i.e., trace TR1 and trace TR2), in accordance with a preferred embodiment.
Figure 5:
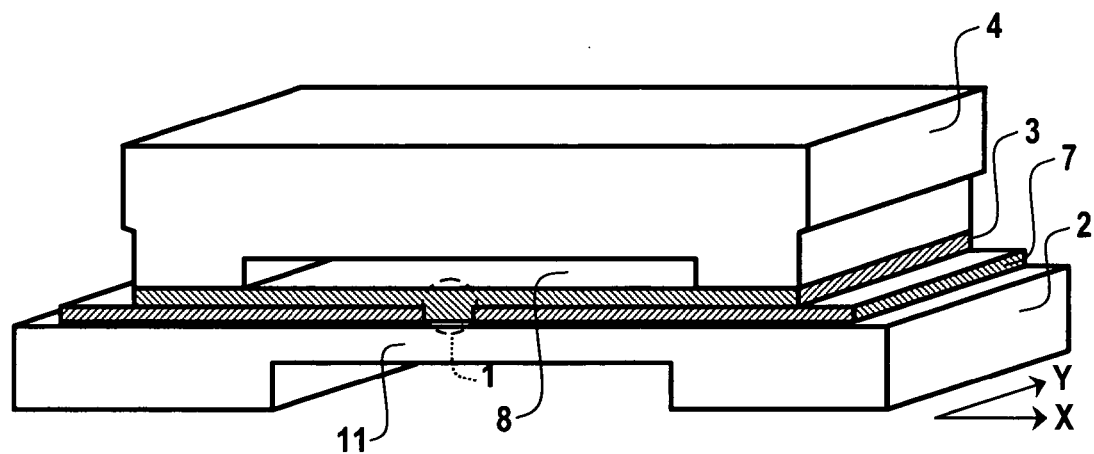
FIG. 5 illustrates a cross-sectional view of a single chip, which can be implemented in accordance with a preferred embodiment.

FIG. 4 represents the same view as depicted in FIG. 3(*b*) after a first dicing step (i.e., trace TR1 and trace TR2), in accordance with a preferred embodiment. The depth of the dry etching of the quartz wafer "cover" 4 depends on the vertical accuracy of the positioning of the disk of the dicing equipment relative to the surface of the quartz wafer "base" 2 during the removal of the strips over the pads with trace TR1 and trace TR2 as depicted in FIG. 4. Trace TR1 and trace TR2 are the first traces performed during the final "sawing" for obtaining the individual chips. Their importance will be discussed in greater detail herein. Ordinarily, there is no need to etch more than 10 microns for this purpose.

Figure 2A:
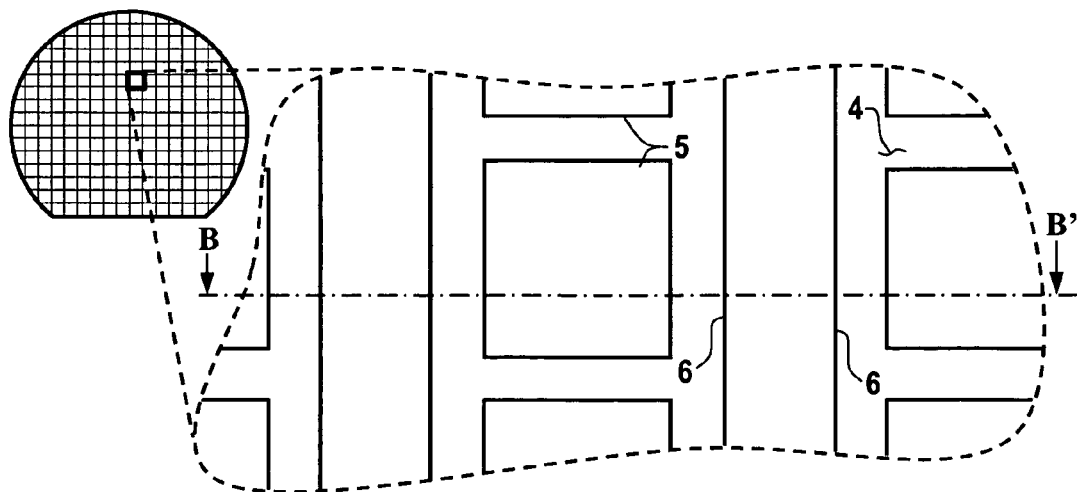
FIG. 2(a) illustrates an upper view of a part of a wafer that will be bonded to the wafer depicted in FIG. 1(a), in accordance with a preferred embodiment.
Figure 2B:
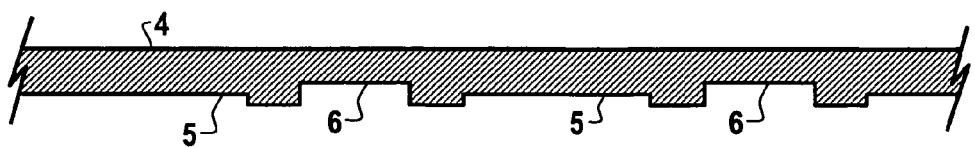
FIG. 2(b) illustrates a view of the BB' cross section depicted in FIG. 2(a), in accordance with a preferred embodiment.

The grooves 5 and the trenches 6 depicted in FIG. 2(*a*) and FIG. 2(*b*) can be realized simultaneously or in separate processes if the depth for must be different, depending upon design considerations. If the cavity located over the resonator 8 depicted in FIG. 3(*b*) is designed to serve, also, as an over pressure stop for the diaphragm deflection, the groove should preferably possess a short depth. To accomplish such a goal, two-nickel masks should be utilized successively. First, the mask for the short etch (i.e., the etch of groove 5) should be utilized, followed by the etch for the trench 6. A thick resist should be utilized for patterning the second nickel layer due to the realization of the previously etched grooves.

Following the realization of the grooves and trenches on the wafer "cover" 4, the nickel can be removed by a proper method, such as, for example, a Piranha solution ($H_2SO_4$: $H_2O_2$) or a Transene Nickel TFB etching solution. The grooves and the trenches can be obtained, also, by wet etching. To accomplish this, a Au/Cr mask can be utilized and the etching solution configured as a mixture of HF and $NH_4F$ 1:1 at 55° C. In this manner, for example, 1 micron of quartz can be etched in approximately 5 minutes.

The next step for the realization of the pressure sensor involves the bonding of the "base" wafer 2 to the "cover" wafer 4. Several methods can be utilized for this purpose. Such methods can be classified in: (i) direct bonding methods, (ii) bonding by using an intermediate layer as SOG (Spin-on-Glass) or Glass Frit and (iii) gluing the two wafers by using an adequate polymer (e.g., BCB). Even if some of these techniques appear simple, they can lead to some functional and technological complications, later, during fabrication. For example, the glass frit technique may induce a bigger influence to the thermal behavior of the sensor as well as the impossibility of accurately controlling the cavity dimension for over-pressure stop.

In accordance with a preferred embodiment, it is recommended that the direct bonding method (i.e., reference can still be made "direct" bonding even if the "base" wafer is covered with polished APCVD $SiO_2$) be utilized, or the bonding with an intermediate layer of SOG. Both methods: (i) ensure high surface energies for bonding, (ii) can be realized with conventional MEMS equipment and (iii) over-pressure stop cavities can be accurately realized.

If a direct bonding methodology is utilized, then the two wafers can be initially cleaned in nitric acid for 150 min at 80° C. A hidrophilisation process can follow by immersing the wafers in an RCA1 solution ($NH_4OH:H_2O_2:H_2O$, 6:1:1) at 65° C. for 10 min. After hidrophilisation the wafers can be rinsed in DI water, dried by spinning and aligned with a special alignment and exposure system.

The wafers can be put in contact after alignment and a thermal annealing follows. The annealing can be accomplished in a furnace, in $N_2$, at 400° C. for 1 hour in a similar manner as described above or by utilizing dedicated bonding equipment found in typical MEMS foundries. The advantage of utilizing special bonders is the eventual sealing in vacuum. Thus, an absolute pressure sensor can be obtained. Instead of hidrophilisation, plasma activation process can be used. The two wafers can be treated in $O_2$ plasma prior the bonding. In this manner, a superior surface energy can be obtained that is useful for the strength of the bonding.

If SOG is utilized as in intermediate layer between the two wafers the process is as follows. First, SOG can be deposited by spaying over the grooves and trenches on the "cover" wafer. The thin glass layer obtained in this way is cured for 5 min at 180° C. The two wafers can be aligned one versus the other after curing and bonded together by utilizing the same equipment as mentioned previously. In order to ensure a high surface energy a subsequent thermal annealing can be performed at 200° C. for 10 hours.

The next step involves the lapping and CMP (Chemical Mechanical Polishing) of the "base" wafer 2 that is now bonded to the "cover" 4. The thickness of the "base" can be adjusted according to the desired thickness of the diaphragm 11 and/or the duration of the etching. The duration of the dry etching should be short enough in order to decrease the processing costs.

After CMP, the "base" wafer can be prepared for dry etching. For this purpose, a nickel mask can be utilized. Nickel can be deposited and patterned as in the previous step for the realization of grooves and trenches in the "cover" 4. If a deep etch is necessary for the realization of the diaphragm, a thicker layer of nickel may be needed. In this situation the nickel mask can be obtained by electroplating nickel on a seed layer of Au/Cr previously deposited by sputtering or vacuum evaporation.

The diaphragm 11 can be realized by dry etching in the same manner as for the realization of the grooves 5 and trenches 6 in the "cover" wafer. If the etching is performed only with $SF_6$, the selectivity of the etching with respect to the Ni mask is greater then a factor of 40 due to the passivation of Ni with $NiF_2$. The $NiF_2$ can, however, act also as a micro-mask during etching altering the quality of the etched surface. For this reason Ar or Xe should be added to the chemistry in order to sputter away this by-product.

Figure 6:
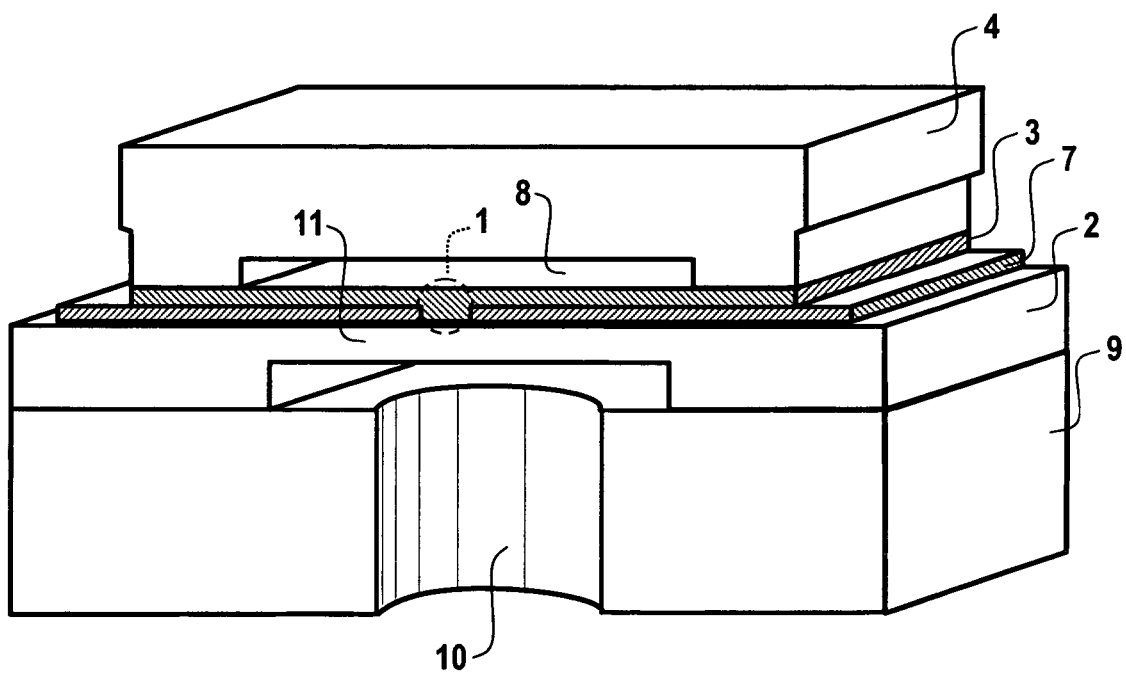
FIG. 6 illustrates a cross-sectional view of a single chip from a stack formed by bonding together three wafers ("base", "cover" and "support"), in accordance with a preferred embodiment.
Figure 7:
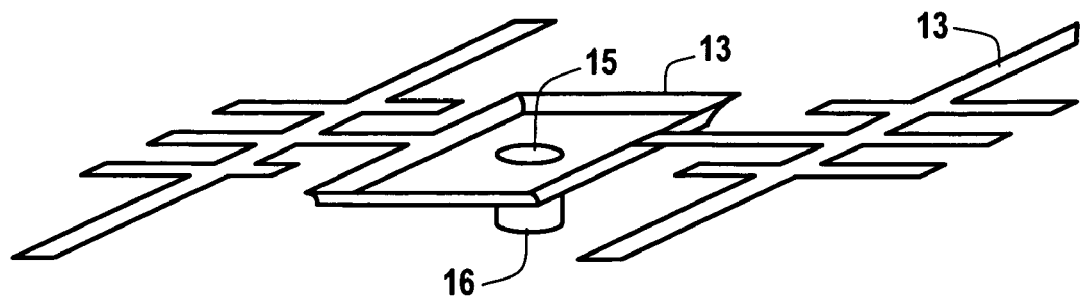
FIG. 7 illustrates a sketch of a lead frame required for packaging, in accordance with a preferred embodiment.
Figure 8:
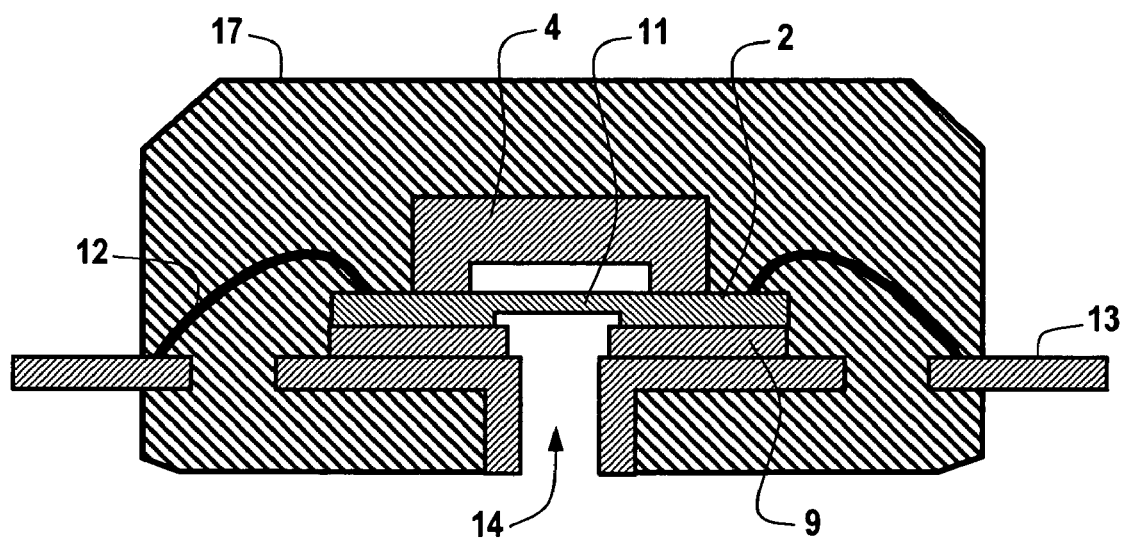
FIG. 8 illustrates a cross sectional view of a packaged SAW pressure sensor, which can be implemented in accordance with a preferred embodiment.

FIG. 6 illustrates a cross-sectional view of a single chip from a stack formed by bonding together three wafers ("base", "cover" and "support"), in accordance with a preferred embodiment. If a thicker rim around the diaphragm is required in order to decrease the thermal mismatch between the sensor and its case after packaging and to increase the rigidity of the stack after the first dicing step, the system formed by the "base" and the "cover" can be bonded or glued to third wafers also configured from quartz or another material that has a similar TCE. The third wafer (e.g., the "support" wafer 9 in FIG. 6) can be provided with holes 10 that allow pressure to be applied to the diaphragm on the "base" wafer 2. Such holes 10 can be easily realized by sand blasting. The sand blasting process is as quick as several seconds per hole.

The stack formed with the two or three wafers can be diced in two steps: (i) the first step (e.g., see FIG. 4) may be required in order to remove part of the "cover" 4 over the pads 7 and (ii) in the second step individual chips are obtained (e.g., see FIG. 5 and FIG. 6). In between the two steps, the stack can be immersed in buffered hydrofluoric acid to remove the passivation $SiO_2$ layer 3 over the pads 7. Thus, the chip can be connected to the lead frame by wire bonding.

During the first dicing step, two traces TR1 and TR2 (e.g., see FIG. 4) may be required for each trench cavity in the "cover" wafer 4. The two traces remove a strip from the "cover", thereby allowing direct access to the pads 7. The "base" wafer from the stack is not touched by the diamond disc of the dicer during the first dicing step. For this reason, the depth of the trench in the cover should be larger than the positioning error on the vertical direction of the dicing disc. Usually this depth is no larger than several microns.

All traces in the first dicing step can be performed in the same direction (let's call "X" direction). The second dicing step is the conventional process used in IC fabrication for obtaining the individual dies. Two traces are needed: one for the "X" direction and other for "Y" direction. In summary, 4 traces are needed for dicing the stack: three on "X" direction and one in "Y" direction. Note that the 4 traces can be reduced to 3 traces, if the two connection pads of the sensor are located on the same side of the chip. Thus, TR2 may not be necessary and can be replaced with a trace performed via the second step described above in the "X" direction.

The stack formed by the two or three bonded wafers can be packaged utilizing a modified packaging approach. After gluing the chip on the lead frame 13 (e.g. see FIG. 7), a trimming process can be performed in order to adjust the central resonant frequency of the SAW sensor. For this purpose, a laser trimming process through the quartz "cover" can be utilized. An electrical connection 12 between the pads of the chip and the lead frame can be realized by conventional wire bonding (ultrasonic or thermo-compression) (e.g., see FIG. 8).

For the pressure sensor embodiment disclosed herein, an opening 14 in the package may be required during molding. This opening 14 can be obtained utilizing a special lead frame, such as lead frame 13 depicted in FIG. 7. The sensor can be mounted into an embossed frame provided with a hole 15 in its center. A small cylinder 16 can be attached to this frame (e.g., by welding) in order to avoid the contact of the resin 17 (FIG. 8) with the diaphragm during molding. In this manner, by using a modified lead frame, specially designed for mounting the SAW pressure sensor, the full advantage of IC packaging techniques can be obtained.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

The embodiments of the invention in which an exclusive property or right is claimed are defined as follows. Having thus described the invention what is claimed is:

1. A pressure sensor method, comprising the steps of:
   micro-machining a base from a first wafer;
   micro-machining a cover from a second wafer by dry etching said wafer in order to form a plurality of grooves thereof, which are adaptable for use with at least one of the following: a reference chamber, at least one over-pressure stop; and at least one trench subsequently formed upon said wafer, wherein said base and said cover form a vacuum seal therebetween; and
   disposing a pressure sensing element within said vacuum between said base and said cover within said vacuum seal to form a vacuum sealed pressure sensor thereof.

2. The method of claim 1 further comprising the step of configuring said pressure sensing element to comprise at least one surface acoustic wave resonator.

3. The method of claim 2 wherein further comprising the step of configuring said base to support said at least one surface acoustic wave resonator.

4. A pressure sensor method, comprising the steps of:
   micro-machining a base from a first wafer;
   micro-machining cover from a second wafer, wherein said base and said cover form a vacuum seal therebetween;
   disposing a pressure sensing element comprising at least one surface acoustic wave delay line device within said vacuum between said base and said cover within said vacuum seal to form a vacuum sealed pressure sensor thereof; and configuring said pressure sensing element to comprise at least one surface acoustic wave delay line device; and configuring said base to support said at least one surface acoustic wave delay line device.

5. The method of claim 1 further comprising the step of bonding said first wafer to said second wafer.

6. The method of claim 5 further comprising the step of micro-machining a mechanical support from a third wafer to support said base and said cover, wherein said third wafer is bonded to said first and second wafers.

7. The method of claim 6 wherein said first, second and third wafers form a stack when bonded together.

8. The method of claim 7 further comprising the step of forming said base from said first wafer of said stack by lapping and mirror polishing said first wafer by chemical mechanical polishing (CMP).

9. The method of claim 6 further comprising the step of forming a diaphragm by micro-machining said first wafer to form said base upon which said diaphragm is located.

10. The method of claim 9 wherein the step of forming said diaphragm further comprises the step of wet etching said first wafer in order to form said diaphragm.

11. The method of claim 9 further comprising the step of forming said diaphragm further comprises the step of dry etching said first wafer in order to form said diaphragm.

12. The method of claim 7 further comprising the step of micro-machining said mechanical support from said third wafer by sand blasting in order to obtain holes thereof.

13. The method of claim 12 further comprising the step of bonding said mechanical support to said base by bonding through an intermediate layer of at least one of the following: a glass frit, SOG, or a polymer.

14. The method of claim 1 further comprising the steps of performing a fist dicing operation in which all of a plurality of traces are processed in an X direction;

performing a second dicing operation in which at least one trace among said plurality of traces is processed in said X direction and at least one other trace is processed in a Y-direction such that at least three traces among said plurality of traces are required for dicing a stack of wafers, including said first wafer, said second wafer and at least one other wafer.

15. The method of claim 1 further comprising the step of:
configuring said vacuum sealed pressure sensor as a package that comprises an embossed lead frame having an opening centrally located therein during a molding of said package, wherein said vacuum sealed pressure sensor is mounted into said embossed frame; and attaching a cylinder to said embossed lead frame in order to avoid contact with a resin with a diaphragm thereof during molding thereof.

16. A pressure sensor method, comprising the steps of:
micro-machining a base from a first wafer;

micro-machining a cover from a second wafer, by dry etching said wafer in order to form a plurality of grooves thereof, which are adaptable for use with at least one of the following: a reference chamber, at least one over-pressure stop, and at least one trench subsequently formed upon said wafer, wherein said base and said cover form a vacuum seal between said base and said cover;

micro-machining a mechanical support from a third wafer to support said base and said cover, wherein said third wafer is bonded to said first and second wafers;

forming a diaphragm by micro-machining said first wafer to form said base upon which said diaphragm is located, configuring a pressure sensing element to comprise at least one surface acoustic wave device;

configuring said base to support said at least one surface acoustic wave device; and disposing said pressure sensing element within said vacuum between said base and said cover within said vacuum seal to form a vacuum sealed pressure sensor thereof.

17. A pressure sensor system, comprising:

a base micro-machined from a first wafer;

a cover micro-machined from a second wafer, wherein said base and said cover form a vacuum seal therebetween;

a pressure sensing element disposed within said vacuum between said base and said cover within said vacuum seal to form a vacuum sealed pressure sensor thereof;

a mechanical support micro-machined from a third wafer to support said base and said cover, wherein said third wafer is bonded to said first and second wafers, wherein said first, second and third wafers form a stark when bonded together;

a diaphragm micro-machining from said first wafer to form said base upon which said diaphragm is located; and wherein said vacuum sealed pressure sensor is configured as a package that comprises an embossed lead frame having an opening centrally located therein during a molding of said package, wherein said vacuum sealed pressure sensor is mounted into said embossed frame; and wherein a cylinder is attached to said embossed lead frame in order to avoid contact with a resin a diaphragm thereof during molding thereof.

* * * * *